United States Patent
Nakamura et al.

(10) Patent No.: US 10,177,059 B2
(45) Date of Patent: Jan. 8, 2019

(54) METHOD FOR MANUFACTURING SEMICONDUCTOR APPARATUS USING A BASE-ATTACHED ENCAPSULANT

(71) Applicant: SHIN-ETSU CHEMICAL CO., LTD., Tokyo (JP)

(72) Inventors: Tomoaki Nakamura, Annaka (JP); Hideki Akiba, Annaka (JP); Toshio Shiobara, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/490,016

(22) Filed: Apr. 18, 2017

(65) Prior Publication Data

US 2017/0330813 A1    Nov. 16, 2017

(30) Foreign Application Priority Data

May 11, 2016 (JP) ................................ 2016-095289

(51) Int. Cl.
*H01L 21/56* (2006.01)
*H01L 23/29* (2006.01)
(Continued)

(52) U.S. Cl.
CPC .......... *H01L 23/295* (2013.01); *H01L 21/561* (2013.01); *H01L 21/568* (2013.01);
(Continued)

(58) Field of Classification Search
CPC ... H01L 23/28; H01L 23/3135; H01L 21/563; H01L 21/56; H01L 21/568;
(Continued)

(56) References Cited

U.S. PATENT DOCUMENTS

| 2014/0138857 A1* | 5/2014 | Akiba | H01L 21/561 257/791 |
| 2015/0028497 A1* | 1/2015 | Nakamura | H01L 21/561 257/787 |
| 2015/0179481 A1* | 6/2015 | Lin | H01L 21/568 257/790 |

FOREIGN PATENT DOCUMENTS

| JP | 2014-095047 A | 5/2014 |
| JP | 2014-197670 A | 10/2014 |
| JP | 2015-032647 A | 2/2015 |

OTHER PUBLICATIONS

May 18, 2018 Office Action Issued in U.S. Appl. No. 15/715,455.

* cited by examiner

*Primary Examiner* — Thanh T Nguyen
(74) *Attorney, Agent, or Firm* — Oliff PLC

(57) ABSTRACT

A base-attached encapsulant for semiconductor encapsulation is used for collectively encapsulating a device-mounted surface of the semiconductor device-mounted substrate having semiconductor devices mounted thereon or a device-formed surface of a semiconductor device-formed wafer having semiconductor devices formed thereon. The base-attached encapsulant has a base and an encapsulating resin layer containing an uncured or semi-cured thermosetting resin component formed onto one of the surfaces of the base, and a linear expansion coefficient $\alpha^1$ of the semiconductor device to be encapsulated by the base-attached encapsulant, a linear expansion coefficient $\alpha^2$ of a cured product of the encapsulating resin layer, and a linear expansion coefficient $\alpha^3$ of the base satisfy both of the following formula (1) and (2);

$$\alpha^1 < \alpha^3 < \alpha^2 \quad (1)$$

$$-2 < \alpha^1 + \alpha^2 - 2\alpha^3 < 2 \quad (2)$$

(Continued)

wherein the unit of the linear expansion coefficient is ppm/K. The base-attached encapsulant for semiconductor encapsulation which suppress package warpage even if a package with a large area is encapsulated.

4 Claims, 2 Drawing Sheets

(51) Int. Cl.
 *H01L 21/78* (2006.01)
 *H01L 23/31* (2006.01)
 *H01L 23/00* (2006.01)
(52) U.S. Cl.
 CPC .......... *H01L 21/78* (2013.01); *H01L 23/3114* (2013.01); *H01L 23/3128* (2013.01); *H01L 23/562* (2013.01); *H01L 24/96* (2013.01); *H01L 2224/04105* (2013.01); *H01L 2224/12105* (2013.01); *H01L 2924/3511* (2013.01)
(58) Field of Classification Search
 CPC ......... H01L 2223/54486; H01L 23/295; H01L 21/561; H01L 24/96; H01L 23/3114; H01L 21/78; H01L 23/29; H01L 23/00; H01L 23/31
 See application file for complete search history.

METHOD FOR MANUFACTURING SEMICONDUCTOR APPARATUS USING A BASE-ATTACHED ENCAPSULANT

TECHNICAL FIELD

The present invention relates to a base-attached encapsulant for semiconductor encapsulation, a semiconductor apparatus manufactured by using the base-attached encapsulant for semiconductor encapsulation, and a method for manufacturing the same.

BACKGROUND ART

In recent years, miniaturization, thinning and high performance of electronic devices represented by mobile phones, smart phones, tablet terminals, etc., have been required, and semiconductor apparatus constituting the electronic devices have also been required to be miniaturized, thinned and high density packaging. As a semiconductor package manufacturing technology realizing such a requirement, a fan-out wafer level package technology attracts a great deal of attention. The fan-out wafer level package is a general term for packages that form rewiring layers also outside the area of semiconductor devices by using the conventional wafer level rewiring technology. In a BGA (Ball Grid Array) type package, etc., as a general type of semiconductor package, it is necessary to mount a semiconductor device on a package substrate and perform wire bonding. On the other hand, in the fan-out wafer level package, a small package of a bare chip level can be realized by replacing the package substrate, the wiring, etc., with thin film wiring bodies and bonding them to the semiconductor device.

As a method for manufacturing such a fan-out wafer level package, it has been known a method in which a plurality of semiconductor devices are temporarily fixed on a support substrate to which a double-sided adhesive sheet is adhered as a temporary fixing material, after a plurality of the semiconductor devices are collectively encapsulated with an encapsulating resin, the adhesive sheet is removed from the encapsulated body, and then a rewiring layer is formed on the surface of the encapsulated body to which the adhesive sheet has been adhered (see Patent Documents 1 to 3). In these methods for manufacturing a fan-out wafer level package, a large area is collectively encapsulated from the viewpoint of a manufacturing cost, but warpage of the package, in particular, warpage after removal of the support substrate and the temporary fixing material is a serious problem.

PRIOR ART REFERENCES

Patent Documents

Patent Document 1: Japanese Patent Laid-Open Publication No. 2015-032647
Patent Document 2: Japanese Patent Laid-Open Publication No. 2014-197670
Patent Document 3: Japanese Patent Laid-Open Publication No. 2014-095047

SUMMARY OF INVENTION

Problem to be Solved by Invention

The present invention has been done to solve the problems, and an object thereof is to provide a base-attached encapsulant for semiconductor encapsulation which can suppress warpage of the package even when a package with a large area is encapsulated, a semiconductor apparatus in which the semiconductor device is encapsulated by the encapsulant, and a method for manufacturing the semiconductor apparatus.

Means for Solving Problem

To achieve the object, the present invention provides a base-attached encapsulant for semiconductor encapsulation which is used for collectively encapsulating a device-mounted surface of a semiconductor device-mounted substrate having semiconductor devices mounted thereon or a device-formed surface of a semiconductor device-formed wafer having semiconductor devices formed thereon, wherein the base-attached encapsulant for semiconductor encapsulation has a base and an encapsulating resin layer containing an uncured or semi-cured thermosetting resin component formed onto one of the surfaces of the base, and a linear expansion coefficient $\alpha^1$ of the semiconductor device to be encapsulated by the base-attached encapsulant for semiconductor encapsulation, a linear expansion coefficient $\alpha^2$ of a cured product of the encapsulating resin layer, and a linear expansion coefficient $\alpha^3$ of the base satisfy both of the following formula (1) and (2);

$$\alpha^1 < \alpha^3 < \alpha^2 \tag{1}$$

$$-2 < \alpha^1 + \alpha^2 - 2\alpha^3 < 2 \tag{2}$$

wherein the unit of the linear expansion coefficient is ppm/K.

Such a base-attached encapsulant for semiconductor encapsulation can suppress the warpage of the whole package even when a large-area package is to be encapsulated by canceling minute warpage in each region of the semiconductor device region and the resin region at which no semiconductor device is present.

In addition, it is preferred that the linear expansion coefficient $\alpha^1$, the linear expansion coefficient $\alpha^2$, and the linear expansion coefficient $\alpha^3$ satisfy the following formula (3) and (4), in addition to the formula (1) and (2);

$$\alpha^3 - \alpha^1 < 5 \tag{3}$$

$$\alpha^2 - \alpha^3 < 5 \tag{4}$$

wherein the unit of the linear expansion coefficient is ppm/K.

When such a base-attached encapsulant for semiconductor encapsulation is employed, warpage in each region of the semiconductor device region and the resin region at which no semiconductor device is present becomes further minute whereby unevenness at the surface can be suppressed. Accordingly, in particular, when the base-attached encapsulant for semiconductor encapsulation is used for manufacturing a fan-out wafer level package, it can be avoided the problem that it cannot get on the step at the time of forming the rewiring layer.

The base is preferably a fiber-containing resin base in which a thermosetting resin composition has been impregnated into the fiber base and cured.

When such a base is employed, the linear expansion coefficient of the base itself can be made small, and it is possible to further suppress the warpage of the semiconductor device region.

In addition, the encapsulating resin layer is preferably a material containing no thermoplastic resin component or a material containing 2% by mass or less of a thermoplastic resin component based on a total mass of a composition for forming the encapsulating resin layer.

When such an encapsulating resin layer is employed, the encapsulating resin layer after curing can be made a material excellent in chemical resistance at the time of the plating process in the rewiring layer forming step.

It is preferred that the encapsulating resin layer contain an inorganic filler, and an amount of the inorganic filler be 75 to 95% by mass based on a total mass of a composition for forming the encapsulating resin layer.

When such a base-attached encapsulant for semiconductor encapsulation is employed, warpage of the package can be further suppressed.

The present invention also provides a semiconductor apparatus comprising a semiconductor device being encapsulated by the encapsulating resin layer of the base-attached encapsulant for semiconductor encapsulation.

Such a semiconductor apparatus can be suppressed in warpage of the package even if the encapsulating surface has a large area.

In this case, the semiconductor apparatus is preferably a fan-out wafer level package.

The present invention also provides a method for manufacturing a semiconductor apparatus comprising collectively encapsulating a device-mounted surface of a semiconductor device-mounted substrate having semiconductor devices mounted thereon or a device-formed surface of a semiconductor device-formed wafer having semiconductor devices formed thereon by a cured product of the encapsulating resin layer of the base-attached encapsulant for semiconductor encapsulation.

When such a method for manufacturing a semiconductor apparatus is employed, a semiconductor apparatus suppressed in warpage of the package can be easily manufactured even if the encapsulating surface has a large area.

The method for manufacturing a semiconductor apparatus of the present invention preferably comprises: a coating step of coating a device-mounted surface of a semiconductor device-mounted substrate, in which semiconductor devices have been temporary fixed onto a support substrate by a laminated temporary fixing material, with the encapsulating resin layer of the base-attached encapsulant for semiconductor encapsulation; an encapsulating step of collectively encapsulating the device-mounted surface by heating the encapsulating resin layer to cure the same; a temporary fixing material-removing step of removing the temporary fixing material; a rewiring step of preparing a rewiring body by forming a rewiring layer onto an exposed surface after removal of the temporary fixing material; and a dicing step of manufacturing the semiconductor apparatus by dicing the rewiring body.

When such a method for manufacturing a semiconductor apparatus is employed, a semiconductor apparatus of a fan-out wafer level package suppressed in warpage of the package can be manufactured even if the encapsulating surface has a large area.

Effect of Invention

As mentioned above, according to the base-attached encapsulant for semiconductor encapsulation of the present invention, warpage of the package can be suppressed even if a package having a large area is to be encapsulated. In addition, according to the base-attached encapsulant for semiconductor encapsulation of the present invention, the sheet shape can be maintained and warpage of the package can be lowered even if the encapsulating resin layer does not contain a thermoplastic resin component. Accordingly, there is no need to formulate the thermoplastic resin component which has conventionally been blended to maintain the sheet shape to the encapsulating resin layer, and the encapsulating resin layer after curing can be made a material excellent in chemical resistance at the time of the plating process in a rewiring layer forming step for manufacturing a fan-out wafer level package. That is, the base-attached encapsulant for semiconductor encapsulation of the present invention is particularly suitable for manufacturing the fan-out wafer level package. Further, according to the semiconductor apparatus of the present invention, the semiconductor device can be encapsulated by the base-attached encapsulant for semiconductor encapsulation of the present invention, so that the semiconductor apparatus can be suppressed in warpage of the package even if the encapsulating surface has a large area. Moreover, according to the method for manufacturing a semiconductor apparatus of the present invention, such a semiconductor apparatus can be easily manufactured, and a semiconductor apparatus of the fan-out wafer level package can be also manufactured.

DESCRIPTION OF EMBODIMENTS

The present inventors have intensively studied to solve the problem of warpage in the manufacture of the fan-out wafer level package. As a result, they have found that the problem can be solved by making the relation of the linear expansion coefficients of the base and the cured product of the encapsulating resin layer in the base-attached encapsulant for semiconductor encapsulation, and the linear expansion coefficient of the semiconductor device to be encapsulated, in a specific range, whereby accomplished the present invention.

That is, the present invention is directed to a base-attached encapsulant for semiconductor encapsulation which is used for collectively encapsulating a device-mounted surface of the semiconductor device-mounted substrate having semiconductor devices mounted thereon or a device-formed surface of a semiconductor device-formed wafer having semiconductor devices formed thereon, wherein the base-attached encapsulant for semiconductor encapsulation has a base and an encapsulating resin layer containing an uncured or semi-cured thermosetting resin component formed onto one of the surfaces of the base, and a linear expansion coefficient $\alpha^1$ of the semiconductor device to be encapsulated by the base-attached encapsulant for semiconductor encapsulation, a linear expansion coefficient $\alpha^2$ of a cured product of the encapsulating resin layer, and a linear expansion coefficient $\alpha^3$ of the base satisfy both of the following formula (1) and (2);

$$\alpha^1 < \alpha^3 < \alpha^2 \tag{1}$$

$$-2 < \alpha^1 + \alpha^2 - 2\alpha^3 < 2 \tag{2}$$

wherein the unit of the linear expansion coefficient is ppm/K.

In the following, the base-attached encapsulant for semiconductor encapsulation, the semiconductor apparatus, and the method for manufacturing a semiconductor apparatus of the present invention are explained in detail, but the present invention is not limited thereto.

[Base-Attached Encapsulant for Semiconductor Encapsulation]

Figure 1:
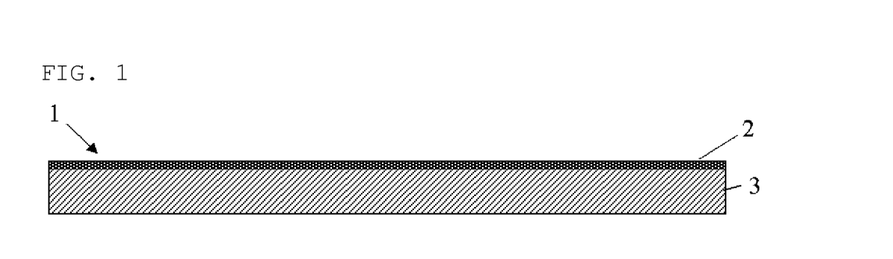
FIG. 1 is a schematic cross-sectional view showing one example of the inventive base-attached encapsulant for semiconductor encapsulation.

FIG. 1 is a schematic cross-sectional view showing one example of the inventive base-attached encapsulant for semiconductor encapsulation. The base-attached encapsulant 1 for semiconductor encapsulation of FIG. 1 has a base 2, and an encapsulating resin layer 3 containing an uncured or semi-cured thermosetting resin component formed onto one of the surfaces of the base 2. Also, in the present invention, a linear expansion coefficient $\alpha^1$ of the semiconductor device (not shown in the drawing) to be encapsulated by the base-attached encapsulant for semiconductor encapsulation, a linear expansion coefficient $\alpha^2$ of a cured product of the encapsulating resin layer 3, and a linear expansion coefficient $\alpha^3$ of the base 2 satisfy both of the following formula (1) and (2);

$$\alpha^1 < \alpha^3 < \alpha^2 \tag{1}$$

$$-2 < \alpha^1 + \alpha^2 - 2\alpha^3 < 2 \tag{2}$$

wherein the unit of the linear expansion coefficient is ppm/K.

If the linear expansion coefficients $\alpha^1$, $\alpha^2$, and $\alpha^3$ satisfy both of the formula (1) and (2), it is possible to cancel minute warpage in each region of the semiconductor device region and the resin region at which no semiconductor device is present, so that warpage of the whole package can be suppressed even when a package with a large area is to be encapsulated.

It is preferred that the linear expansion coefficient $\alpha^1$ of the semiconductor device to be encapsulated by the base-attached encapsulant for semiconductor encapsulation, the linear expansion coefficient $\alpha^2$ of a cured product of the encapsulating resin layer, and the linear expansion coefficient $\alpha^3$ of the base satisfy the following formula (3) and (4), in addition to the formula (1) and (2);

$$\alpha^3 - \alpha^1 < 5 \tag{3}$$

$$\alpha^2 - \alpha^3 < 5 \tag{4}$$

wherein the unit of the linear expansion coefficient is ppm/K.

If the linear expansion coefficients $\alpha^1$, $\alpha^2$, and $\alpha^3$ satisfy the formula (3) and (4), in addition to the formula (1) and (2), warpage in each region of the semiconductor device region and the resin region at which no semiconductor device is present becomes more minute, whereby unevenness of the surface can be suppressed. Accordingly, when the base-attached encapsulant for semiconductor encapsulation is used for the manufacture of a fan-out wafer level package, it can be avoided the problem that it cannot get on the step at the time of forming the rewiring layer.

Among the linear expansion coefficients $\alpha^1$, $\alpha^2$ and $\alpha^3$, with regard to the linear expansion coefficient $\alpha^1$ of the semiconductor device, the linear expansion coefficient $\alpha^1$ of the semiconductor device to be encapsulated by the base-attached encapsulant for semiconductor encapsulation may be previously obtained. Also, with regard to the linear expansion coefficient $\alpha^2$ of the cured product of the encapsulating resin layer, and the linear expansion coefficient $\alpha^3$ of the base, a material(s) which satisfies the formula (1) and (2), and in some cases, further the formula (3) and (4) may be appropriately selected. In particular, with regard to the encapsulating resin layer, the linear expansion coefficient $\alpha^2$ of the cured product can be adjusted by the kind of the resin to be used or the blending amount of an additive(s) such as an inorganic filler, etc. In addition, when the base is made, for example, a fiber-containing resin base in which a thermosetting resin composition is impregnated into a fiber base and cured, the linear expansion coefficient $\alpha^3$ of the base can be adjusted by the kind of the resin of the thermosetting resin composition to be impregnated into the fiber base or the blending amount of an additive(s) such as an inorganic filler, etc.

<Base>

In the present invention, a material which can be used as a base 2 constituting the base-attached encapsulant 1 for semiconductor encapsulation is not particularly limited, and an inorganic substrate, a metal substrate, or an organic resin substrate, etc., may be used depending on the linear expansion coefficient, etc., of the semiconductor device which is an object to be encapsulated. In particular, as an organic resin substrate, a fiber-containing organic resin substrate may be used.

A thickness of the base is preferably 20 μm to 1 mm, more preferably 30 μm to 500 μm, in either of the inorganic substrate, the metal substrate, or the organic resin substrate. If it is 20 μm or more, it is preferred since it can suppress to be easily deformed due to being too thin. If it is 1 mm or less, it is preferred since it can suppress the semiconductor apparatus itself becoming thick.

Representative examples of the inorganic substrate include a ceramic substrate, a glass substrate, a silicon wafer, etc. Representative examples of the metal substrate include a copper substrate and an aluminum substrate whose surfaces are subjected to insulation treatment. Examples of the organic resin substrate include a resin-impregnated fiber base in which a thermosetting resin or a filler, etc., is impregnated into a fiber base, a fiber-containing resin base in which the thermosetting resin is semi-cured or cured, and a resin substrate in which a thermosetting resin, etc., is molded to a substrate shape. Representative examples thereof include a BT (bismaleimide triazine) resin substrate, a glass epoxy substrate, an FRP (fiber reinforced plastic) substrate, etc.

The thermosetting resin to be used for the organic resin substrate is not particularly limited, and examples thereof include a BT resin, an epoxy resin, etc., and an epoxy resin, a silicone resin, an epoxy-silicone hybrid resin, and further a cyanate ester resin, etc., which are generally used for encapsulating the semiconductor devices and exemplified by the following.

As the thermosetting resin to be impregnated into the fiber base, for example, when a base-attached encapsulant for semiconductor encapsulation of the present invention is manufactured by using a resin-impregnated fiber base which uses a thermosetting epoxy resin or a fiber-containing resin base which is semi-cured after impregnating the epoxy resin as a base, the thermosetting resin to be used for the encapsulating resin layer formed onto one of the surfaces of the base is preferably also the epoxy resin. When the thermosetting resin impregnated into the substrate and the thermosetting resin to be used for the encapsulating resin layer formed onto one of the surfaces of the base are the same kinds as mentioned above, it is preferred since the resins can be simultaneously cured when the device-mounted surface of the semiconductor device-mounted substrate is collectively encapsulated, whereby more firm encapsulating function can be accomplished.

The base is particularly preferably a fiber-containing resin base in which a thermosetting resin composition is impregnated into a fiber base and cured. In the following, the fiber-containing resin base is explained in more detail.

[Fiber Base]

Examples of a material which can be used as the fiber base in the organic resin substrate include inorganic fiber such as carbon fiber, glass fiber, quartz glass fiber, metal fiber, etc., and organic fiber such as aromatic polyamide fiber, polyimide fiber, polyamideimide fiber, etc., and further, silicon carbide fiber, titanium carbide fiber, boron fiber, alumina fiber, etc., and any material may be used depending on the product characteristics. The most preferred examples of the fiber base include glass fiber, quartz glass fiber, carbon fiber, etc. Among these, glass fiber or quartz glass fiber having high insulating properties is particularly preferred.

[Thermosetting Resin Composition]

The thermosetting resin composition to be impregnated into the fiber base contains a thermosetting resin.

(Thermosetting Resin)

The thermosetting resin to be used in the thermosetting resin composition is not particularly limited, and examples thereof include a resin which is generally used for encapsulating the semiconductor device such as an epoxy resin, a silicone resin, an epoxy-silicone hybrid resin, and a cyanate ester resin, etc. In addition, a thermosetting resin such as a BT resin, etc., may be used.

<<Epoxy Resin>>

The epoxy resin that can be used for the thermosetting resin composition in the present invention may be for example, but not particularly limited to, any known epoxy resins in a liquid state and a solid state at room temperature. Illustrative examples thereof include a bisphenol A type epoxy resin; a bisphenol F type epoxy resin; a biphenol type epoxy resin such as a 3,3',5,5'-tetramethyl-4,4'-biphenol type epoxy resin, and a 4,4'-biphenol type epoxy resin; a phenol novolac type epoxy resin; a cresol novolac type epoxy resin; a bisphenol A novolac type epoxy resin; a naphthalenediol type epoxy resin; a trisphenylolmethane type epoxy resin; a tetrakisphenylolethane type epoxy resin; a phenoldicyclopentadiene novolac type epoxy resin; a hydrogenated epoxy resin thereof, the aromatic ring of which has been hydrogenated; and alicyclic epoxy resin. It is also possible to blend an epoxy resin other than the foregoing with a certain amount in accordance with a purpose and needs.

In the thermosetting resin composition containing an epoxy resin, a curing agent for the epoxy resin may be contained. Examples of a usable curing agent include a phenol novolac resin, various kinds of amine derivatives, an acid anhydride, and those in which an acid anhydride group is partially ring-opened to form a carboxylic acid. Above all, a phenol novolac resin is preferred to ensure the reliability of a semiconductor apparatus to be manufactured by using the inventive base-attached encapsulant for semiconductor encapsulation. It is particularly preferred that an epoxy resin and a phenol novolac resin be mixed such that the ratio of the epoxy group to the phenolic hydroxyl group is 1:0.8 to 1:1.3.

In addition, imidazole derivatives, phosphine derivatives, amine derivatives, a metal compound such as an organic aluminum compound may be used as a reaction promoter (a catalyst) to promote the reaction of the epoxy resin and the curing agent.

The thermosetting resin composition containing an epoxy resin may further contain various kinds of additives, if necessary. For example, for the purpose of improving the properties of the resin, various kinds of additives such as thermoplastic resins, thermoplastic elastomers, organic synthetic rubbers, stress lowering agents of silicone type or other type, waxes, and a halogen-trapping agent may be added depending on the purpose.

<<Silicone Resin>>

As to the silicone resin which can be used for the thermosetting resin composition in the present invention, although it is not particularly limited, a thermosetting or UV curable silicone resin can be mentioned. In particular, the thermosetting resin composition containing a silicone resin preferably contains an addition curable silicone resin composition. The addition curable silicone resin composition particularly preferably includes (A) an organosilicon compound having a nonconjugated double bond (e.g., diorganopolysiloxane containing an alkenyl group), (B) an organohydrogenpolysiloxane, and (C) a platinum-based catalyst as essential components. These components of (A) to (C) will be described below.

Component (A): Organosilicon Compound having Nonconjugated Double Bond

Examples of the organosilicon compound having a nonconjugated double bond of the component (A) include an organopolysiloxane shown by the following general formula (a) such as a linear diorganopolysiloxane both molecular terminals of which are blocked with triorganosiloxy groups containing an aliphatic unsaturated bond:

(a)

wherein $R^{11}$ represents a monovalent hydrocarbon group containing a nonconjugated double bond, $R^{12}$ to $R^{17}$ each represent an identical or different monovalent hydrocarbon group, and "a" and "b" are each an integer satisfying $0 \leq a \leq 500$, $0 \leq b \leq 250$, and $0 \leq a+b \leq 500$.

In the general formula (a), $R^{11}$ is a monovalent hydrocarbon group containing a nonconjugated double bond, and preferably a monovalent hydrocarbon group containing a nonconjugated double bond of an aliphatic unsaturated bond as typified by an alkenyl group preferably having 2 to 8 carbon atoms, particularly preferably 2 to 6 carbon atoms.

In the general formula (a), $R^{12}$ to $R^{17}$ are each the same or different monovalent hydrocarbon group; examples thereof include an alkyl group, an alkenyl group, an aryl group, and an aralkyl group each preferably having 1 to 20 carbon atoms, particularly preferably 1 to 10 carbon atoms. Among these, more preferable examples of $R^{14}$ to $R^{17}$ include a monovalent hydrocarbon group except for an aliphatic unsaturated bond; particularly preferable example thereof include an alkyl group, an aryl group, or aralkyl group, which do not have an aliphatic unsaturated bond such as an alkenyl group. Among these, $R^{16}$ and $R^{17}$ are preferably an aromatic monovalent hydrocarbon group, particularly preferably an aryl group having 6 to 12 carbon atoms, such as a phenyl group and a tolyl group.

In the general formula (a), "a" and "b" are each an integer satisfying 0≤a≤500, 0≤b≤250, and 0≤a+b≤500; "a" is preferably 10≤a≤500; "b" is preferably 0≤b≤150; and a+b preferably satisfies 10≤a+b≤500.

The organopolysiloxane shown by the general formula (a) can be obtained, for example, by an alkali equilibration reaction of a cyclic diorganopolysiloxane such as cyclic diphenylpolysiloxane and cyclic methylphenylpolysiloxane with a disiloxane such as diphenyltetravinyldisiloxane and divinyltetraphenyldisiloxane to constitute a terminal group. In this case, since, in an equilibration reaction by an alkali catalyst (particularly a strong alkali such as KOH), polymerization proceeds even with a small amount of the catalyst by an irreversible reaction; thereby a ring-opening polymerization alone proceeds quantitatively and a terminal blocking ratio becomes high. Therefore, a silanol group and a chlorine content are generally not contained.

The organopolysiloxane shown by the general formula (a) may be exemplified by the following, wherein "k" and "m" are each an integer satisfying 0≤k≤500, 0≤m≤250, and 0≤k+m≤500, preferably an integer satisfying 5≤k+m≤250 and 0≤m/(k+m)≤0.5.

The organopolysiloxane having a linear structure shown by the general formula (a) may be used as the component (A) in combination with an organopolysiloxane having a three-dimensional network structure including a trifunctional siloxane unit, a tetrafunctional siloxane unit, etc., if needed. Such an organosilicon compound having a nonconjugated double bond may be used alone or in combination of two or more kinds.

The amount of the group having a nonconjugated double bond (e.g., the monovalent hydrocarbon group having a double bond such as an alkenyl group and bonded to a Si atom) in the organosilicon compound having a nonconjugated double bond of the component (A), is preferably 0.1 to 20 mol % of the total amount of the monovalent hydrocarbon groups (the total amount of the monovalent hydrocarbon groups bonded to Si atoms), more preferably 0.2 to 10 mol %, particularly preferably 0.2 to 5 mol %. The reason why these amounts are preferable is that if the amount of the group having a nonconjugated double bond is 0.1 mol % or more, a good cured product can be obtained when it is cured, and if it is 20 mol % or less, the mechanical properties of a cured product become good.

In addition, the organosilicon compound having a nonconjugated double bond of the component (A) preferably contains an aromatic monovalent hydrocarbon group (an aromatic monovalent hydrocarbon group bonded to a Si atom); the content of the aromatic monovalent hydrocarbon group is preferably 0 to 95 mol % of the total amount of the monovalent hydrocarbon groups (the total amount of the monovalent hydrocarbon groups bonded to Si atoms), more preferably 10 to 90 mol %, particularly preferably 20 to 80 mol %. The aromatic monovalent hydrocarbon group provides a merit that a cured product has good mechanical properties and is easy to produce when it is contained in the resin with a suitable amount.

Component (B): Organohydrogenpolysiloxane

The component (B) is preferably an organohydrogenpolysiloxane having two or more hydrogen atoms bonded to silicon atoms (hereinafter referred to as "SiH group") per molecule. The organohydrogenpolysiloxane having two or more SiH groups per molecule functions as a crosslinker and enables the formation of a cured product by addition reaction of the SiH group in the component (B) with the group having a nonconjugated double bond, such as a vinyl group and the other alkenyl group, in the component (A).

The organohydrogenpolysiloxane of the component (B) preferably has an aromatic monovalent hydrocarbon group. If the organohydrogenpolysiloxane has an aromatic monovalent hydrocarbon group, compatibility with the component (A) can be increased. Such an organohydrogen-polysiloxane may be used alone or in combination of two or more kinds. For example, the organohydrogenpolysiloxane having an aromatic hydrocarbon group may be contained as a part of the component (B) or used as all of the component (B).

Examples of the organohydrogenpolysiloxane of the component (B) include 1,1,3,3-tetramethyldisiloxane, 1,3,5,7-tetramethylcyclotetrasiloxane, tris(dimethylhydrogensiloxy)methylsilane, tris(dimethylhydrogensiloxy)-phenylsilane, 1-glycidoxypropyl-1,3,5,7-tetramethylcyclotetrasiloxane, 1,5-glycidoxypropyl-1,3,5,7-tetramethylcyclotetrasiloxane, 1-glycidoxypropyl-5-trimethoxysilylethyl-1,3,5,7-tetramethylcyclotetrasiloxane, methylhydrogenpolysiloxane both molecular terminals of which are blocked with trimethylsiloxy groups, a dimethylsiloxane/methylhydrogensiloxane copolymer both molecular terminals of which are blocked with trimethylsiloxy groups, dimethylpolysiloxane both molecular terminals of which are blocked with dimethylhydrogensiloxy groups, a dimethylsiloxane/methylhydrogensiloxane copolymer both molecular terminals of which are blocked with dimethylhydrogensiloxy groups, a methylhydrogensiloxane/diphenylsiloxane copolymer both molecular terminals of which are blocked with trimethylsiloxy groups, a methylhydrogensiloxane/diphenylsiloxane/dimethylsiloxane copolymer both molecular terminals of which are blocked with trimethylsiloxy groups, a trimethoxysilane polymer, a copolymer of $(CH_3)_2HSiO_{1/2}$ units and $SiO_{4/2}$ units, and a copolymer of $(CH_3)_2HSiO_{1/2}$ units, $SiO_{4/2}$ units, and $(C_6H_5)SiO_{3/2}$ units, but it is not particularly limited.

In addition, compounds shown by the following structures or an organohydrogenpolysiloxane obtained by using these compounds as raw materials may also be used.

The molecular structure of the organohydrogenpolysiloxane of the component (B) may be any of a linear, cyclic, branched, or three-dimensional network structure, and the number of silicon atoms in one molecule (or a polymerization degree in case of a polymer) is preferably 2 or more, more preferably 3 to 500, particularly preferably 4 to 300 approximately.

The organohydrogenpolysiloxane of the component (B) is preferably contained such that the number of SiH group in the component (B) is 0.7 to 3.0, particularly 1.0 to 2.0 per one group having a nonconjugated double bond, such as an alkenyl group, in the component (A).

Component (C): Platinum-Based Catalyst

Illustrative examples of the platinum-based catalyst of the component (C) include a chloroplatinic acid, an alcohol-modified chloroplatinic acid, a platinum complex having a chelate structure. These may be used alone or in combination of two or more kinds.

The amount of the platinum-based catalyst of the component (C) may be an effective amount for curing (a so-called catalytic amount). A preferable amount thereof is generally 0.1 to 500 ppm in terms of a mass of the platinum group metal per a total amount of 100 parts by mass of the component (A) and the component (B), and the range of 0.5 to 100 ppm is particularly preferable.

<<Epoxy-Silicone Hybrid Resin>>

Examples of the epoxy resin and the silicone resin used in the hybrid resin which can be used for the thermosetting resin composition in the present invention, though they are not particularly limited, include the above-described epoxy resin and the above-described silicone resin. The hybrid resin herein mentioned means a material which forms a co-crosslinking structure by reacting with each other at the time of curing.

<<Cyanate Ester Resin>>

Examples of the cyanate ester resin which can be used for the thermosetting resin composition in the present invention, though it is not particularly limited, include a resin composition containing a cyanate ester compound or an oligomer thereof and a phenol compound and/or a dihydroxynaphthalene compound as a curing agent.

Cyanate Ester Compound or Oligomer Thereof

The component used as a cyanate ester compound or an oligomer thereof is shown by the following general formula (b):

wherein $R^2$ and $R^2$ each represent a hydrogen atom or an alkyl group having 1 to 4 carbon atoms; $R^3$ represents any of:

$R^4$ represents a hydrogen atom or a methyl group; and "n" is an integer of 0 to 30.

The cyanate ester compound is a compound having two or more cyanate groups per molecule, and illustrative examples thereof include a cyanic acid ester of a polycyclic aromatic divalent phenol such as bis(3,5-dimethyl-4-cyanatephenyl)methane, bis(4-cyanatephenyl)methane, bis(3-methyl-4-cyanatephenyl)-methane, bis(3-ethyl-4-cyanatephenyl)methane, bis(4-cyanatephenyl)-1,1-ethane, bis(4-cyanatephenyl)-2,2-propane, di(4-cyanatephenyl) ether, and di(4-cyanatephenyl)thio ether; a polycyanic acid ester of a polyvalent phenol such as a phenol novolac type cyanate ester, a cresol novolac type cyanate ester, a phenylaralkyl type cyanate ester, a biphenylaralkyl type cyanate ester, and a naphthalenearalkyl type cyanate ester.

The above-described cyanate ester compound can be obtained by reaction between phenols and cyanogen chloride under basic conditions. The cyanate ester compound may be selected properly depending on the use from the wide range of materials with characteristics varied due to its structure from a solid state having a softening point of 106° C. to a liquid state at room temperature.

Among them, a cyanate ester compound having a small cyanate group equivalent, i.e., a small amount of molecular weight between functional groups exhibits a slight curing shrinkage, enabling a cured product having low thermal expansion and high Tg (glass transition temperature) to be obtained. Meanwhile a cyanate ester compound having a large cyanate group equivalent exhibits a slightly reduced Tg but increases the flexibility of a triazine cross-linking distance, enabling reduction in elasticity, increase in toughness, and reduction in water absorbability to be expected.

Chlorine bonded to or remained in the cyanate ester compound is preferably 50 ppm or less, more preferably 20 ppm or less. If it is 50 ppm or less, there is few possibility that chlorine or chlorine ions, liberated by thermal decomposition when being stored at a high temperature for a long period of time, corrode an oxidized Cu frame, Cu wire or Ag plating, thereby causing exfoliation or electric failure; and the resin attains good insulation property.

Curing Agent

Generally, as a curing agent and a curing catalyst of a cyanate ester resin, a metal salt, a metal complex, or a phenolic hydroxyl group or a primary amine each having an active hydrogen is used. In the present invention, a phenol compound or a dihydroxynaphthalene compound is preferably used.

Examples of the phenol compound which can be preferably used for the curing agent of the above-described cyanate ester resin, though it is not particularly limited, include ones shown by the following general formula (c):

wherein $R^5$ and $R^6$ each represent a hydrogen atom or an alkyl group having 1 to 4 carbon atoms; $R^7$ represents any of:

$R^4$ represents a hydrogen atom or a methyl group; and "p" is an integer of 0 to 30.

Examples of the phenol compound include a phenol resin, a bisphenol F type resin, a bisphenol A type resin, a phenol novolac resin, a phenolaralkyl type resin, a biphenylaralkyl type resin, and a naphthalenearalkyl type resin having two phenolic hydroxyl groups per molecule; these may be used alone or in combination of two or more kinds.

Among the phenol compound, those having a small phenolic hydroxyl group equivalent, for example, a hydroxyl group equivalent of 120 or less, has high reactivity with a cyanate group, and therefore the curing reaction proceeds at a low temperature of 120° C. or lower. In this case, it is preferable to reduce the molar ratio of the hydroxyl group to the cyanate group. This ratio is preferably in the range of 0.05 to 0.11 mol per 1 mol of the cyanate group. In this case, a cured product which exhibits a slight curing shrinkage, a low thermal expansion, and high Tg can be obtained.

In contrast, a phenol compound having a large phenolic hydroxyl group equivalent, for example, a hydroxyl group equivalent of 175 or more, has an inhibited reactivity with a cyanate group, and therefore a composition having good storage stability and good flowability can be obtained. The ratio is preferably in the range of 0.1 to 0.4 mol per 1 mol of the cyanate group. In this case, a cured product having low water absorption but a slightly reduced Tg can be obtained. These phenol resins may be used in combination of two or more kinds to obtain desired curability and characteristics of the cured product.

The dihydroxynaphthalene which can be suitably used for the curing agent of the above-described cyanate ester resin is shown by the following general formula (d).

Examples of the dihydroxynaphthalene include 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 2,6-dihydroxynaphthalene, 2,7-dihydroxynaphthalene. 1,2-dihydroxynaphthalene, 1,3-dihydroxynaphthalene, and 1,6-dihydroxynaphthalene, each having a melting point of 130° C., have very high reactivity and promote cyclization reaction of the cyanate group with a small amount. 1,5-dihydroxynaphthalene and 2,6-dihydroxynaphthalene, each having a melting point of 200° C. or higher, relatively suppress the reaction.

Use of the dihydroxynaphthalene alone makes the molecular weight between functional groups small and the structure rigid, thereby enabling a cured product having a slight curing shrinkage and high Tg to be obtained. In addition, use of the dihydroxynaphthalene in combination with a phenol compound that has two or more hydroxyl groups per molecule and hence has a large hydroxyl group equivalent enables the curability to be adjusted.

A halogen element and an alkali metal in the phenol compound and the dihydroxynaphthalene are preferably 10 ppm or less, particularly preferably 5 ppm or less when extracted at 120° C. under 2 atm.

(Colorant)

In the present invention, the thermosetting resin composition preferably contains colorant in addition to the above-described thermosetting resin. When the thermosetting resin composition contains colorant, appearance failure can be suppressed and laser marking property can be improved.

The colorant to be used is not particularly limited, and any kind of known pigment and dye can be used alone or in combination of two or more kinds. Particularly, colorant with a color in the black range is preferable in view of improving the appearance and the laser marking property.

Illustrative examples of the colorant with a color in the black range include carbon black (furnace black, channel black, acetylene black, thermal black, lamp black, etc.), graphite, copper oxide, manganese dioxide, azo pigments (azomethine black, etc.), aniline black, perylene black, titanium black, cyanine black, active carbon, ferrite (non-magnetic ferrite, magnetic ferrite, etc.), magnetite, chromium oxide, iron oxide, molybdenum disulfide, a chromium complex, complex oxide black pigment (complex inorganic black pigment), anthraquinone type organic black pigment. Among them, carbon black is preferably used.

The colorant is preferably contained in an amount of 0.1 to 30 parts by mass, particularly 1 to 15 parts by mass based on 100 parts by mass of the thermosetting resin composition. When the blending amount of the colorant is 0.1 parts by mass or more, good coloring of a base, suppressed appearance failure, and good laser marking property are realized. When the blending amount of the colorant is 30 parts by mass or less, it is possible to avoid markedly lowering of workability due to an increase of the viscosity of a thermosetting resin composition to be impregnated into a fiber base in producing a base.

(Inorganic Filler)

The thermosetting resin composition may be blended with an inorganic filler in the present invention. Examples of the inorganic filler to be blended include silica such as fused silica and crystalline silica, alumina, silicon nitride, aluminum nitride, aluminosilicate, boron nitride, glass fiber, and antimonous trioxide.

In particular, when the thermosetting resin composition contains an epoxy resin, the inorganic filler to be blended may be previously subjected to surface treatment with a coupling agent such as a silane coupling agent, a titanate coupling agent, etc. to increase bonding strength of the epoxy resin and the inorganic filler.

Preferable examples of the coupling agent include epoxy functional alkoxysilanes such as γ-glycidoxypropyltrimethoxysilane, γ-glycidoxypropylmethyldiethoxysilane, and β-(3,4-epoxycyclohexyl)ethyltrimethoxysilane; amino functional alkoxysilanes such as N-β-(aminoethyl)-γ-aminopropyltrimethoxysilane, γ-aminopropyltriethoxysilane, and N-phenyl-γ-aminopropyltrimethoxysilane; and mercapto functional alkoxysilanes such as γ-mercaptopropyltrimethoxysilane. Incidentally, the blending amount of the coupling agent to be used for the surface treatment and a method of the surface treatment are not particularly limited.

The blending amount of the inorganic filler is preferably 100 to 1,300 parts by mass, particularly preferably 200 to 1,000 parts by mass based on 100 parts by mass of the total mass of the resin component such as an epoxy resin and a silicone resin in the thermosetting resin composition. If it is 100 parts by mass or more, sufficient strength can be obtained. If it is 1,300 parts by mass or less, a failure in filling due to the reduction in flowability can be suppressed, whereby the semiconductor devices mounted on the substrate and the semiconductor devices formed on the wafer can be excellently encapsulated. This inorganic filler is preferably contained in an amount of 50 to 95% by mass, particularly 60 to 90% by mass based on the total mass of the thermosetting resin composition.

As mentioned above, when the base is, for example, a fiber-containing resin base in which a thermosetting resin composition is impregnated into the fiber base and cured, the linear expansion coefficient $\alpha^3$ of the base can be adjusted by the kind of the resin to be used in the thermosetting resin composition impregnated into the fiber base or the blending amount of the additive(s) such as an inorganic filler, etc.

<Encapsulating Resin Layer>

As shown in FIG. 1, the base-attached encapsulant 1 for semiconductor encapsulation of the present invention has an encapsulating resin layer 3 on one of the surfaces of the base 2. The encapsulating resin layer 3 contains an uncured or semi-cured thermosetting resin component. The encapsulating resin layer 3 has a role of collectively encapsulating the device-mounted surface of the semiconductor device-mounted substrate on which the semiconductor devices have been mounted or the device-formed surface of the semiconductor device-formed wafer on which the semiconductor devices have been formed.

The thickness of the encapsulating resin layer is not particularly limited, and preferably 20 μm or more and 2,000 μm or less. If it is 20 μm or more, it is preferred since it is sufficient to encapsulate the semiconductor device-mounted surface of various substrates on which the semiconductor devices have been mounted, and occurrence of failure in filling property due to being too thin can be suppressed. If it is 2,000 μm or less, it is preferred since it is possible to prevent the encapsulated semiconductor apparatus from becoming too thick.

[Thermosetting Resin Component]

The composition for forming the encapsulating resin layer contains a thermosetting resin component. The thermosetting resin is not particularly limited, and in general, it is preferably a thermosetting resin such as a liquid epoxy resin or a solid epoxy resin, a silicone resin, an epoxy-silicone hybrid resin, or a cyanate ester resin, etc., to be used for encapsulating the semiconductor device. In particular, the thermosetting resin is preferably a material containing any of an epoxy resin, a silicone resin, an epoxy-silicone hybrid resin, and a cyanate ester resin, each of which solidifies at lower than 50° C. and melts at 50° C. or higher and 150° C. or lower.

Such an epoxy resin, a silicone resin, an epoxy-silicone hybrid resin, and a cyanate ester resin may be exemplified by the same materials as exemplified by the thermosetting resin contained in the thermosetting resin composition to be impregnated into the fiber base as mentioned above.

[Thermoplastic Resin Component]

In the present invention, the encapsulating resin layer may contain or may not contain the thermoplastic resin component, and when the thermoplastic resin component is contained, the blending amount of the thermoplastic resin component is preferably 2% by mass or less based on the total mass of the composition for forming the encapsulating resin layer.

In general, the thermoplastic resin component is used as a component to provide flexibility to the encapsulating resin layer, and in the conventional resin sheet, etc., it has been added to improve handling property and to retain the sheet shape. In the base-attached encapsulant for semiconductor encapsulation of the present invention, since the encapsulating resin layer is supported by the substrate, even if the encapsulating resin layer does not contain the thermoplastic resin component, it becomes the material that the handling property is good and the sheet shape is retained.

Further, in the conventional resin sheet in which a large amount of the thermoplastic resin component is blended in the encapsulating resin layer as described above, there is a problem that the encapsulating resin is easily deteriorated by the chemicals to be used at the time of the plating process in the rewiring layer forming step for manufacturing the fan-out wafer level package. However, in the base-attached encapsulant for semiconductor encapsulation of the present invention, the encapsulating resin layer can be made a material containing no thermoplastic resin component, or containing only a small amount, i.e., 2% by mass or less of the thermoplastic resin component based on the total mass of the composition for forming the encapsulating resin layer, so that the encapsulating resin layer after curing can be made excellent in chemical resistance at the time of the plating process in the rewiring layer forming step. That is, it can be made particularly suitable for manufacturing the fan-out wafer level package.

Examples of the thermoplastic resin include various kinds of acrylic copolymer such as a polyacrylic acid ester, etc., a styrene-acrylate-based copolymer, a rubbery polymer such as butadiene rubber, styrene-butadiene rubber (SBR), an ethylene-vinyl acetate copolymer (EVA), isoprene rubber, acrylonitrile rubber, etc., an urethane-based elastomer, a silicone-based elastomer, a polyester-based elastomer, etc.

[Inorganic Filler]

In addition, in the composition for forming the encapsulating resin layer, an inorganic filler may be blended as in the thermosetting resin composition to be impregnated into the fiber base. The inorganic filler may be exemplified by the same materials as those blended in the thermosetting resin composition to be impregnated into the fiber base as mentioned above.

The blending amount of the inorganic filler is preferably 300 to 1,300 parts by mass, particularly preferably 500 to 1,000 parts by mass based on 100 parts by mass of the total mass of the resin component such as an epoxy resin and a silicone resin in the thermosetting resin composition. If it is 300 parts by mass or more, it is possible to suppress the difference in the linear expansion coefficient between the encapsulating resin layer and the base, which is suitable for suppressing warpage of the semiconductor device. If it is 1,300 parts by mass or less, failure in filling property due to lowering in fluidity is suppressed, and as a result, the semiconductor devices mounted onto the substrate or the semiconductor devices formed onto the wafer can be well encapsulated. This inorganic filler is preferably contained in an amount of 75 to 95% by mass, particularly 80 to 90% by mass based on the total mass of thermosetting resin composition.

[Other Additives]

The composition for forming the encapsulating resin layer may contain, if necessary, other additives in addition to the components. Examples of such additives include an antimony compound such as antimony trioxide, etc., a molybdenum compound such as zinc molybdate-carried talc, zinc molybdate-carried zinc oxide, etc., a phosphazene compound, a hydroxide such as aluminum hydroxide, magnesium hydroxide, etc., a flame retardant such as zinc borate, zinc stannate, etc., a colorant such as carbon black, etc., a halogen ion trapping agent such as hydrotalcite, etc.

As mentioned above, the linear expansion coefficient $\alpha^2$ of the cured product of the encapsulating resin layer can be adjusted by the kind of the resin to be used for the composition for forming the encapsulating resin layer or the blending amount of the additive(s) such as an inorganic filler, etc.

[Method for Manufacturing Base-Attached Encapsulant for Semiconductor Encapsulation]

The base-attached encapsulant for semiconductor encapsulation of the present invention can be manufactured by forming an encapsulating resin layer onto one of the surfaces of the base. The encapsulating resin layer can be formed by various methods such as a method in which a composition containing an uncured or semi-cured thermosetting resin (the composition for forming the encapsulating resin layer) is laminated onto one of the surfaces of the base in a sheet state or a film state, using vacuum lamination, high temperature vacuum press, heating roll, etc., a method in which a composition containing a thermosetting resin such as a liquid-state epoxy resin and silicone resin, etc., is coated by printing or dispense, etc., under reduced pressure or in vacuum and heated, and a method in which a composition containing an uncured or semi-cured thermosetting resin is subjected to press molding, etc.

[Semiconductor Apparatus]

Figure 2:
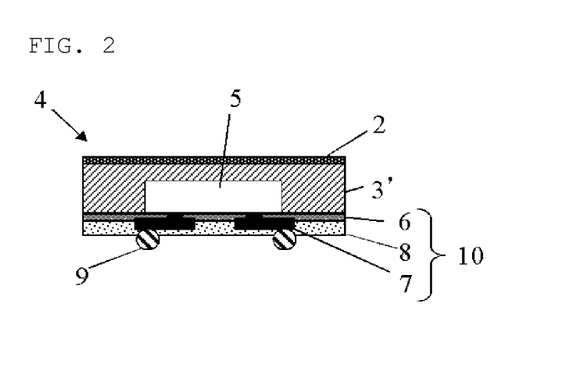
FIG. 2 is a schematic cross-sectional view showing one example of the semiconductor apparatus manufactured by using the inventive base-attached encapsulant for semiconductor encapsulation.

The present invention also provides a semiconductor apparatus which comprises a semiconductor device being encapsulated by the encapsulating resin layer of the base-attached encapsulant for semiconductor encapsulation of the present invention. FIG. 2 is a schematic cross-sectional view showing one example of the semiconductor apparatus manufactured by using the inventive base-attached encapsulant for semiconductor encapsulation.

In the semiconductor apparatus 4 of FIG. 2, the semiconductor device 5 is encapsulated by the encapsulating resin layer 3' after curing, and it has the base 2 of the base-attached encapsulant for semiconductor encapsulation at the surface side of the encapsulating resin layer 3' after curing and a rewiring layer 10 comprising a buffer coat layer 6, a plated pattern layer 7 and an insulation protective layer 8, and further bumps 9 at the reverse side (the semiconductor device 5 side).

As mentioned above, the base-attached encapsulant for semiconductor encapsulation of the present invention is particularly suitable for the manufacture of the fan-out wafer level package. Accordingly, the semiconductor apparatus of the present invention in which the semiconductor device is encapsulated by the base-attached encapsulant for semiconductor encapsulation can be made as the fan-out wafer level package as shown in FIG. 2.

[Method for Manufacturing Semiconductor Apparatus]

The present invention also provides a method for manufacturing a semiconductor apparatus comprising collectively encapsulating a device-mounted surface of a semiconductor device-mounted substrate having semiconductor devices mounted thereon or a device-formed surface of a semiconductor device-formed wafer having semiconductor devices formed thereon by a cured product of the encapsulating resin layer of the base-attached encapsulant for semiconductor encapsulation of the present invention.

In addition, the method for manufacturing a semiconductor apparatus of the present invention is preferably comprises: a coating step of coating a device-mounted surface of a semiconductor device-mounted substrate, in which semiconductor devices have been temporary fixed onto a support substrate by a laminated temporary fixing material, with the encapsulating resin layer of the base-attached encapsulant for semiconductor encapsulation; an encapsulating step of collectively encapsulating the device-mounted surface by heating the encapsulating resin layer to cure the same; a temporary fixing material-removing step of removing the temporary fixing material; a rewiring step of preparing a rewiring body by forming a rewiring layer onto an exposed surface after removal of the temporary fixing material; and a dicing step of manufacturing the semiconductor apparatus by dicing the rewiring body.

Figure 3:
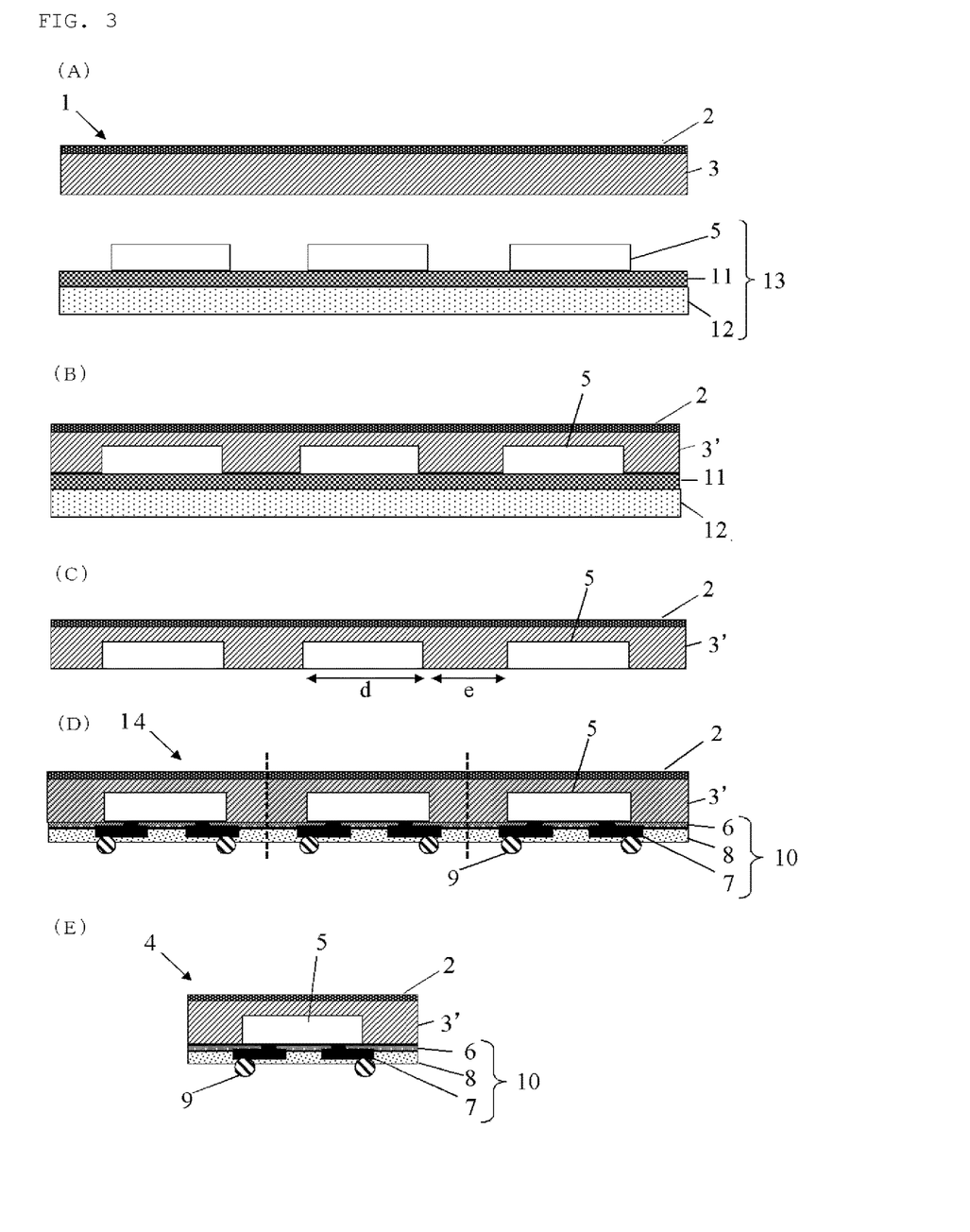
FIG. 3 is a flow chart of one example of the method for manufacturing a semiconductor apparatus from a substrate having semiconductor devices mounted by using the inventive base-attached encapsulant for semiconductor encapsulation.

FIG. 3 is a flow chart of one example of the method for manufacturing a semiconductor apparatus from a substrate having semiconductor devices mounted by using the inventive base-attached encapsulant for semiconductor encapsulation. In the following, the method for manufacturing a semiconductor apparatus of the present invention is specifically explained by referring to FIG. 3.

The method for manufacturing a semiconductor apparatus of FIG. 3 comprises: a coating step (FIG. 3(A)) wherein a device-mounted surface of a semiconductor device-mounted substrate 13, in which semiconductor devices 5 have been temporary fixed onto a support substrate 12 by a temporary fixing material 11 laminated, is coated by an encapsulating resin layer 3 of a base-attached encapsulant 1 for semiconductor encapsulation in which the encapsulating resin layer 3 has been formed onto one of the surfaces of a base 2; an encapsulating step (FIG. 3(B)) wherein the encapsulating resin layer 3 is cured by heating to make an encapsulating resin layer 3' after curing whereby collectively encapsulating the device-mounted surface; a temporary fixing material-removing step (FIG. 3(C)) wherein the support substrate 12 and the temporary fixing material 11 are removed; a rewiring step (FIG. 3(D)) wherein a rewiring layer 10 comprising a buffer coat layer 6, a plated pattern layer 7, and an insulation protective layer 8, and further bumps 9 are formed onto an exposed surface after removing the temporary fixing material to produce a rewiring body 14; and a dicing step (FIG. 3(E)) wherein the rewiring body 14 is subjected to dicing to manufacture a semiconductor apparatus 4.

[Coating Step]

The coating step in the method for manufacturing a semiconductor apparatus of the present invention is a step of coating the device-mounted surface of the semiconductor device-mounted substrate 13, in which the semiconductor devices 5 have been temporary fixed (mounted) onto the support substrate 12 by the laminated temporary fixing material 11, with the encapsulating resin layer 3 of the base-attached encapsulant 1 for semiconductor encapsulation.

The temporary fixing material 11 is not particularly limited, and, for example, a UV peelable adhesive such as a UV curable adhesive, etc., and a heat peelable adhesive such as a heat-foamable adhesive, etc., may be used.

The support substrate 12 is not particularly limited, and, for example, a glass substrate, a silicon wafer, a metal plate such as SUS (stainless steel), etc., a plastic substrate such as polyamide and polyimide, etc., may be used.

[Encapsulating Step]

The encapsulating step of the method for manufacturing a semiconductor apparatus of the present invention is a step after the coating step and a step of collectively encapsulating the semiconductor device-mounted surface of the semiconductor device-mounted substrate by heating the encapsulating resin layer 3 to cure the same to make an encapsulating resin layer 3' after curing. The heating temperature may be, for example, 100 to 200° C., and the heating time may be, for example, 1 to 60 minutes.

[Temporary Fixing Material-Removing Step]

The temporary fixing material-removing step of the method for manufacturing a semiconductor apparatus of the present invention is a step of removing the support substrate 12 and the temporary fixing material 11 from the semiconductor device-mounted substrate after encapsulation.

Incidentally, in FIG. 3(C), "d" shows a length of the semiconductor devices 5 themselves, "e" shows a distance between the semiconductor devices 5, and "d" is preferably 0.1 mm to 30 mm, more preferably 1 mm to 20 mm, and "e" is preferably 0.1 to 50 mm, more preferably 2 to 20 mm. A ratio of "d" and "e", "d/e", is preferably 0.1 to 20, more preferably 0.5 to 5. If "d" and "e" are in such ranges, warpage of the whole package can be more satisfactorily suppressed even in the package of a large area.

In addition, since the base-attached encapsulant for semiconductor encapsulation of the present invention has the base, it is possible to omit a step of adhering a support substrate onto the encapsulating resin surface side, which is required to proceed to the next step in the case of encapsulating with a usual encapsulating resin having no base.

[Rewiring Step]

The rewiring step of the method for manufacturing a semiconductor apparatus of the present invention is a step of forming a rewiring layer 10 onto a semiconductor device surface (exposed surface), which is exposed by removing the temporary fixing material, to produce a rewiring body 14.

The method for forming the rewiring layer is not particularly limited, and examples thereof include a method in which a buffer coat layer 6 is formed onto the exposed semiconductor devices 5 by using a light-sensitive polyimide material or PBO (polybenzoxazole), etc., and patterning, then a plated pattern layer 7 is formed by patterning using the conventionally known method such as the semi-additive method, etc., onto a metal seed layer formed by the metal sputtering method, etc., and an insulation protective layer 8 is formed by using polyimide or PBO, etc., and patterning.

In addition, bumps 9 may be formed onto the formed rewiring layer 10 by the conventionally known method such as solder ball and solder plating, etc.

[Dicing Step]

The dicing step of the method for manufacturing a semiconductor apparatus of the present invention is a step of manufacturing semiconductor apparatuses 4 by dicing the rewiring body 14 to which the rewiring layer has been formed into individual semiconductor apparatus. In addition, printing with a laser mark may be carried out on the semiconductor apparatus diced into individual.

As mentioned above, according to the base-attached encapsulant for semiconductor encapsulation of the present invention, warpage of the package can be suppressed even if a package having a large area is to be encapsulated. In addition, according to the base-attached encapsulant for semiconductor encapsulation of the present invention, the sheet shape can be maintained and warpage of the package can be lowered even if the encapsulating resin layer does not contain a thermoplastic resin component. Accordingly, there is no need to formulate the thermoplastic resin component which has conventionally been blended to maintain the sheet shape to the encapsulating resin layer, and the encapsulating resin layer after curing can be made a material excellent in chemical resistance at the time of the plating process in a rewiring layer forming step for manufacturing a fan-out wafer level package. That is, the base-attached encapsulant for semiconductor encapsulation of the present invention is particularly suitable for manufacturing the fan-out wafer level package. Further, according to the semiconductor apparatus of the present invention, the semiconductor device can be encapsulated by the base-attached encapsulant for semiconductor encapsulation of the present invention, so that the semiconductor apparatus can be suppressed in warpage of the package even if the encapsulating surface has a large area. Moreover, according to the method for manufacturing a semiconductor apparatus of the present invention, such a semiconductor apparatus can be easily manufactured, and a semiconductor apparatus of the fan-out wafer level package can be also manufactured.

EXAMPLES

In the following, the present invention is explained more specifically by referring to Examples and Comparative examples, but the present invention is not limited thereto.

Example 1

<Production of Base>

To 60 parts by mass of a cresol-novolac type epoxy resin (trade name: EPICLON-N695, available from DIC CORPORATION), 30 parts by mass of a phenol-novolac resin (trade name: TD2090, available from DIC CORPORATION), 3 parts by mass of carbon black (trade name: 3230B, available from Mitsubishi Chemical Co., Ltd.) as a black pigment and 0.6 part by mass of a catalyst TPP (triphenylphosphine), 300 parts by mass of toluene was added, and the mixture was mixed by stirring to prepare a toluene dispersion of an epoxy resin composition. An E glass cloth (available from Nitto Boseki Co., Ltd., a thickness: 150 μm) was dipped as a fiber base in the toluene dispersion of the epoxy resin composition to impregnate the toluene dispersion of the epoxy resin composition into the E glass cloth. The glass cloth was allowed to stand at 120° C. for 15 minutes to volatilize the toluene. The glass cloth was molded by heating at 175° C. for 5 minutes to obtain a molded product, and the product was further heated at 180° C. for 4 hours (secondary curing) to cure the impregnated epoxy resin composition whereby an epoxy resin-impregnated fiber base X1 having a size of 400 mm×500 mm and a thickness of 0.16 mm in which cured product layers of the epoxy resin composition have been formed onto the both surfaces of the fiber base layer was obtained.

<Preparation of Resin Composition for Encapsulating Resin Layer>

By using a high speed mixing device, 60 parts by mass of a cresol-novolac type epoxy resin (trade name: EPICLON-N655, available from DIC CORPORATION), 30 parts by mass of a phenol-novolac resin (trade name: BRG555, available from SHOWA DENKO K.K.), 400 parts by mass of spherical silica having an average particle size of 7 μm (trade name: MSS-7, available from TATSUMORI LTD.), 0.2 part by mass of a catalyst TPP (triphenylphosphine), 0.5 part by mass of a silane coupling agent: 3-glycidoxypropyltrimethoxysilane (trade name: KBM403, available from Shin-Etsu Chemical Co., Ltd.) and 3 parts by mass of carbon black (trade name: 3230B, available from Mitsubishi Chemical Co., Ltd.) as a black pigment were sufficiently mixed, heated and kneaded by a continuous kneading device, and then, extruded from a T-die to obtain a sheet state thermosetting resin composition Y1 having a size of 390 mm×490 mm and a thickness of 0.3 mm.

<Manufacture of Base-Attached Encapsulant for Semiconductor Encapsulation>

The sheet state thermosetting resin composition Y1 was mounted onto the epoxy resin-impregnated fiber base X1, and the materials were laminated under the conditions of a vacuum degree of 50 Pa, a temperature of 50° C. and a time of 60 seconds by using a vacuum laminator manufactured by Nikko Materials Co., Ltd. to prepare a base-attached encapsulant Z1 for semiconductor encapsulation.

<Preparation of Semiconductor Device-Mounted Substrate>

An SUS plate having a size of 420 mm×520 mm and a thickness of 1 mm was prepared as a support substrate, and REVALPHA No. 3195V as a temporary fixing material was adhered thereto with the same size, whereby a semiconductor device-mounted substrate in which 200 silicon chips each having a size of 20 mm×20 mm were mounted onto the REVALPHA was prepared.

<Manufacture of Semiconductor Device-Mounted Substrate After Encapsulation>

The base-attached encapsulant Z1 for semiconductor encapsulation and the semiconductor device-mounted substrate were cured and encapsulated by subjecting to compression molding by using a vacuum press manufactured by Nikko Materials Co., Ltd. under the conditions of a vacuum degree of 50 Pa, a pressure of 1.0 MPa at 150° C. for 300 s. After curing and encapsulation, the product was post-cured at 150° C. for 4 hours, and then, REVALPHA and the support substrate were removed at 180° C. to obtain a semiconductor device-mounted substrate after encapsulation.

Example 2

<Production of Base>

The same operation as in Example 1 was carried out except for adding 50 parts by mass of spherical silica having an average particle size of 0.5 μm (trade name: SC-2050, available from Admatechs) to the epoxy resin composition to obtain an epoxy resin-impregnated fiber base X2 having a size of 400 mm×500 mm and a thickness of 0.16 mm.

<Preparation of Resin Composition for Encapsulating Resin Layer>

By using a high speed mixing device, 40 parts by mass of a cresol-novolac type epoxy resin (trade name: EPICLON-N655, available from DIC CORPORATION), 12 parts by mass of a bisphenol A type crystalline epoxy resin (trade name: YL-6810, available from Mitsubishi Chemical Co., Ltd.), 30 parts by mass of a phenol-novolac resin (trade name: BRG555, available from SHOWA DENKO Co., Ltd.), 450 parts by mass of spherical silica having an average particle size of 7 μm (trade name: MSS-7, available from TATSUMORI LTD.), 0.2 part by mass of a catalyst TPP (triphenylphosphine), 0.5 part by mass of a silane coupling agent: 3-glycidoxypropyltrimethoxysilane (trade name: KBM403, available from Shin-Etsu Chemical Co., Ltd.) and 3 parts by mass of carbon black (trade name: 3230B, available from Mitsubishi Chemical Co., Ltd.) as a black pigment were sufficiently mixed, heated and kneaded by a continuous kneading device, and then, extruded from a T-die to obtain a sheet state thermosetting resin composition Y2 having a size of 390 mm×490 mm and a thickness of 0.3 mm.

<Manufacture of Base-Attached Encapsulant for Semiconductor Encapsulation>

The same operation as in Example 1 was carried out except for using the epoxy resin-impregnated fiber base X2 in place of the epoxy resin-impregnated fiber base X1 and using the sheet state thermosetting resin composition Y2 in place of the sheet state thermosetting resin composition Y1 to obtain a base-attached encapsulant Z2 for semiconductor encapsulation.

<Preparation of Semiconductor Device-Mounted Substrate>

In the same manner as in Example 1, a semiconductor device-mounted substrate was prepared.

<Manufacture of Semiconductor Device-Mounted Substrate After Encapsulation>

The same operation as in Example 1 was carried out except for using the base-attached encapsulant Z2 for semiconductor encapsulation in place of the base-attached encapsulant Z1 for semiconductor encapsulation to obtain a semiconductor device-mounted substrate after encapsulation.

Example 3

<Production of Base>

To 50 parts by mass of dimethylpolysiloxane both molecular terminals of which were blocked with vinyl groups as an organosilicon compound having a nonconjugated double bond, 50 parts by mass of a dimethylpolysiloxane both molecular terminals of which were blocked with dimethylhydrogensiloxy groups, 0.2 part by mass of an acetylene alcohol type ethynylcyclohexanol as a reaction inhibitor, 0.1 part by mass of an octyl alcohol-modified solution of chloroplatinic acid and 3 parts by mass of carbon black as a black pigment, 200 parts by mass of toluene was added, and the mixture was mixed by stirring to prepare a toluene dispersion of a silicone resin composition. An E glass cloth (available from Nitto Boseki Co., Ltd., a thickness: 150 μm) was dipped as a fiber base in the toluene dispersion of the silicone resin composition to impregnate the toluene dispersion of the silicone resin composition into the E glass cloth. The glass cloth was allowed to stand at 120° C. for 15 minutes to volatilize the toluene. The glass cloth was molded by heating at 175° C. for 5 minutes to obtain a molded product, and the product was further heated at 150° C. for 10 hours (secondary curing) to cure the impregnated thermosetting resin whereby a silicone resin-impregnated fiber base X3 having a size of 400 mm×500 mm and a thickness of 0.16 mm in which cured product layers of the silicone resin composition have been formed onto the both surfaces of the fiber base layer was obtained.

<Preparation of Resin Composition for Encapsulating Resin Layer>

The same operation as in Example 1 was carried out except for changing the blending amount of the spherical silica having an average particle size of 7 μm to 350 parts by mass to obtain a sheet state thermosetting resin composition Y3 having a size of 390 mm×490 mm and a thickness of 0.3 mm.

<Manufacture of Base-Attached Encapsulant for Semiconductor Encapsulation>

The same operation as in Example 1 was carried out except for using the silicone resin-impregnated fiber base X3 in place of the epoxy resin-impregnated fiber base X1 and using the sheet state thermosetting resin composition Y3 in place of the sheet state thermosetting resin composition Y1 to obtain an base-attached encapsulant Z3 for semiconductor encapsulation.

<Preparation of Semiconductor Device-Mounted Substrate>

In the same manner as in Example 1, a semiconductor device-mounted substrate was prepared.

<Manufacture of Semiconductor Device-Mounted Substrate After Encapsulation>

The same operation as in Example 1 was carried out except for using the base-attached encapsulant Z3 for semiconductor encapsulation in place of the base-attached encapsulant Z1 for semiconductor encapsulation to obtain a semiconductor device-mounted substrate after encapsulation.

Example 4

<Production of Base>

To 60 parts by mass of a cresol-novolac type epoxy resin (trade name: EPICLON-N685, available from DIC CORPORATION), 30 parts by mass of a phenol-novolac resin (trade name: TD2131, available from DIC CORPORATION), 3 parts by mass of carbon black (trade name: 3230B, available from Mitsubishi Chemical Co., Ltd.) as a black pigment and 0.6 part by mass of a catalyst TPP (triphenylphosphine), 300 parts by mass of toluene was added, and the mixture was mixed by stirring to prepare a toluene dispersion of an epoxy resin composition. An E glass cloth (available from Nitto Boseki Co., Ltd., a thickness: 150 μm) was dipped as a fiber base in the toluene dispersion of the epoxy resin composition to impregnate the toluene dispersion of the epoxy resin composition into the E glass cloth. The glass cloth was allowed to stand at 120° C. for 15 minutes to volatilize the toluene. The glass cloth was molded by heating at 175° C. for 5 minutes to obtain a molded product, and the product was further heated at 180° C. for 4 hours (secondary curing) to cure the impregnated epoxy resin composition whereby an epoxy resin-impregnated fiber base X4 having a size of 400 mm×500 mm and a thickness of 0.16 mm in which cured product layers of the epoxy resin composition have been formed onto the both surfaces of the fiber base layer was obtained.

<Preparation of Resin Composition for Encapsulating Resin Layer>

The same operation as in Example 1 was carried out except for changing the blending amount of the spherical silica having an average particle size of 7 μm to 330 parts by mass to obtain a sheet state thermosetting resin composition Y4 having a size of 390 mm×490 mm and a thickness of 0.3 mm.

<Manufacture of Base-Attached Encapsulant for Semiconductor Encapsulation>

The same operation as in Example 1 was carried out except for using the epoxy resin-impregnated fiber base X4 in place of the epoxy resin-impregnated fiber base X1 and using the sheet state thermosetting resin composition Y4 in place of the sheet state thermosetting resin composition Y1 to obtain an base-attached encapsulant Z4 for semiconductor encapsulation.

<Preparation of Semiconductor Device-Mounted Substrate>

In the same manner as in Example 1, a semiconductor device-mounted substrate was prepared.

<Manufacture of Semiconductor Device-Mounted Substrate After Encapsulation>

The same operation as in Example 1 was carried out except for using the base-attached encapsulant Z4 for semiconductor encapsulation in place of the base-attached encapsulant Z1 for semiconductor encapsulation to obtain a semiconductor device-mounted substrate after encapsulation.

Example 5

<Production of Base>

The same operation as in Example 1 was carried out to obtain an epoxy resin-impregnated fiber base X1 having a size of 400 mm×500 mm and a thickness of 0.16 mm.

<Preparation of Resin Composition for Encapsulating Resin Layer>

The same operation as in Example 1 was carried out except for adding 1 part by mass of a thermoplastic resin (trade name: METABLEN J-5800, available from Mitsubishi Rayon Co., Ltd.) to obtain a sheet state thermosetting resin composition Y5 having a size of 390 mm×490 mm and a thickness of 0.3 mm. The sheet state thermosetting resin composition Y5 contains 2% by mass or less amount of the thermoplastic resin based on the total mass of the composition.

<Manufacture of Base-Attached Encapsulant for Semiconductor Encapsulation>

The same operation as in Example 1 was carried out except for using the sheet state thermosetting resin composition Y5 in place of the sheet state thermosetting resin composition Y1 to obtain an base-attached encapsulant Z5 for semiconductor encapsulation.

<Preparation of Semiconductor Device-Mounted Substrate>

In the same manner as in Example 1, a semiconductor device-mounted substrate was prepared.

<Manufacture of Semiconductor Device-Mounted Substrate After Encapsulation>

The same operation as in Example 1 was carried out except for using the base-attached encapsulant Z5 for semiconductor encapsulation in place of the base-attached encapsulant Z1 for semiconductor encapsulation to obtain a semiconductor device-mounted substrate after encapsulation.

Example 6

<Production of Base>

To 60 parts by mass of a cresol-novolac type epoxy resin (trade name: EPICLON-N685, available from DIC CORPORATION), 30 parts by mass of a phenol-novolac resin (trade name: TD2090, available from DIC CORPORATION), 3 parts by mass of carbon black (trade name: 3230B, available from Mitsubishi Chemical Co., Ltd.) as a black pigment and 0.6 part by mass of a catalyst TPP (triphenylphosphine), 300 parts by mass of toluene was added, and the mixture was mixed by stirring to prepare a toluene dispersion of an epoxy resin composition. An E glass cloth (available from Nitto Boseki Co., Ltd., a thickness: 150 μm) was dipped as a fiber base in the toluene dispersion of the epoxy resin composition to impregnate the toluene dispersion of the epoxy resin composition into the E glass cloth. The glass cloth was allowed to stand at 120° C. for 15 minutes to volatilize the toluene. The glass cloth was molded by heating at 175° C. for 5 minutes to obtain a molded product, and the product was further heated at 180° C. for 4 hours (secondary curing) to cure the impregnated epoxy resin composition whereby an epoxy resin-impregnated fiber base X5 having a size of 400 mm×500 mm and a thickness of 0.16 mm in which cured product layers of the epoxy resin composition have been formed onto the both surfaces of the fiber base layer was obtained.

<Preparation of Resin Composition for Encapsulating Resin Layer>

The same operation as in Example 1 was carried out except for adding 20 parts by mass of the thermoplastic resin (trade name: METABLEN J-5800, available from Mitsubishi Rayon Co., Ltd.) to obtain a sheet state thermosetting resin composition Y6 having a size of 390 mm×490 mm and a thickness of 0.3 mm. The sheet state thermosetting resin composition Y6 contains the thermoplastic resin in an amount exceeding 2% by mass based on the total mass of the composition.

<Manufacture of Base-Attached Encapsulant for Semiconductor Encapsulation>

The same operation as in Example 1 was carried out except for using the epoxy resin-impregnated fiber base X5 in place of the epoxy resin-impregnated fiber base X1 and using the sheet state thermosetting resin composition Y6 in place of the sheet state thermosetting resin composition Y1 to obtain an base-attached encapsulant Z6 for semiconductor encapsulation.

<Preparation of Semiconductor Device-Mounted Substrate>

In the same manner as in Example 1, a semiconductor device-mounted substrate was prepared.

<Manufacture of Semiconductor Device-Mounted Substrate After Encapsulation>

The same operation as in Example 1 was carried out except for using the base-attached encapsulant Z6 for semiconductor encapsulation in place of the base-attached encapsulant Z1 for semiconductor encapsulation to obtain a semiconductor device-mounted substrate after encapsulation.

Comparative Example 1

<Preparation of Encapsulating Resin Composition>

The same operation as in Example 1 was carried out to obtain a sheet state thermosetting resin composition Y1 having a size of 390 mm×490 mm and a thickness of 0.3 mm.

<Preparation of Semiconductor Device-Mounted Substrate>

In the same manner as in Example 1, a semiconductor device-mounted substrate was prepared.

<Manufacture of Semiconductor Device-Mounted Substrate After Encapsulation>

The same operation as in Example 1 was carried out except for not using the base and directly encapsulating the substrate with the sheet state thermosetting resin composition Y1 to obtain a semiconductor device-mounted substrate after encapsulation.

Comparative Example 2

<Production of Base>

To 60 parts by mass of the cresol-novolac type epoxy resin (trade name: EPICLON-N655, available from DIC CORPORATION), 30 parts by mass of the phenol-novolac resin (trade name: TD2131, available from DIC CORPORATION), 3 parts by mass of carbon black (trade name: 3230B, available from Mitsubishi Chemical Co., Ltd.) as a black pigment and 0.6 part by mass of catalyst TPP (triphenylphosphine), 300 parts by mass of toluene was added, and the mixture was mixed by stirring to prepare a toluene dispersion of the epoxy resin composition. An E glass cloth (available from Nitto Boseki Co., Ltd., a thickness: 150 μm) was dipped as a fiber base in the toluene dispersion of the epoxy resin composition to impregnate the toluene dispersion of the epoxy resin composition into the E glass cloth. The glass cloth was allowed to stand at 120° C. for 15 minutes to volatilize the toluene. The glass cloth was molded by heating at 175° C. for 5 minutes to obtain a molded product, and the product was further heated at 180° C. for 4 hours (secondary curing) to cure the impregnated epoxy resin composition whereby an epoxy resin-impregnated fiber base X6 having a size of 400 mm×500 mm and a thickness of 0.16 mm in which cured product layers of the epoxy resin composition have been formed onto the both surfaces of the fiber base layer was obtained.
<Preparation of Resin Composition for Encapsulating Resin Layer>
The same operation as in Example 2 was carried out to obtain a sheet state thermosetting resin composition Y2 having a size of 390 mm×490 mm and a thickness of 0.3 mm.
<Manufacture of Base-Attached Encapsulant for Semiconductor Encapsulation>
The same operation as in Example 1 was carried out except for using the epoxy resin-impregnated fiber base X6 in place of the epoxy resin-impregnated fiber base X1 and using the sheet state thermosetting resin composition Y2 in place of the sheet state thermosetting resin composition Y1 to obtain an base-attached encapsulant Z7 for semiconductor encapsulation.
<Preparation of Semiconductor Device-Mounted Substrate>
In the same manner as in Example 1, a semiconductor device-mounted substrate was prepared.
<Manufacture of Semiconductor Device-Mounted Substrate After Encapsulation>
The same operation as in Example 1 was carried out except for using the base-attached encapsulant Z7 for semiconductor encapsulation in place of the base-attached encapsulant Z1 for semiconductor encapsulation to obtain a semiconductor device-mounted substrate after encapsulation.

Comparative Example 3

<Production of Base>
The same operation as in Example 6 was carried out to obtain an epoxy resin-impregnated fiber base X5 having a size of 400 mm×500 mm and a thickness of 0.16 mm.
<Preparation of Resin Composition for Encapsulating Resin Layer>
The same operation as in Example 2 was carried out to obtain a sheet state thermosetting resin composition Y2 having a size of 390 mm×490 mm and a thickness of 0.3 mm.
<Manufacture of Base-Attached Encapsulant for Semiconductor Encapsulation>
The same operation as in Example 1 was carried out except for using the epoxy resin-impregnated fiber base X5 in place of the epoxy resin-impregnated fiber base X1 and using the sheet state thermosetting resin composition Y2 in place of the sheet state thermosetting resin composition Y1 to obtain an base-attached encapsulant Z8 for semiconductor encapsulation.
<Preparation of Semiconductor Device-Mounted Substrate>
In the same manner as in Example 1, a semiconductor device-mounted substrate was prepared.
<Manufacture of Semiconductor Device-Mounted Substrate After Encapsulation>
The same operation as in Example 1 was carried out except for using the base-attached encapsulant Z8 for semiconductor encapsulation in place of the base-attached encapsulant Z1 for semiconductor encapsulation to obtain a semiconductor device-mounted substrate after encapsulation.

Comparative Example 4

<Production of Base>
The same operation as in Example 1 was carried out except for adding 100 parts by mass of spherical silica having an average particle size of 0.5 µm (trade name: SC-2050, available from Admatechs) to the epoxy resin composition to obtain an epoxy resin-impregnated fiber base X7 having a size of 400 mm×500 mm and a thickness of 0.16 mm.
<Preparation of Resin Composition for Encapsulating Resin Layer>
The same operation as in Example 1 was carried out except for changing the blending amount of the spherical silica having an average particle size of 7 µm to 300 parts by mass to obtain a sheet state thermosetting resin composition Y7 having a size of 390 mm×490 mm and a thickness of 0.3 mm.
<Manufacture of Base-Attached Encapsulant for Semiconductor Encapsulation>
The same operation as in Example 1 was carried out except for using the epoxy resin-impregnated fiber base X7 in place of the epoxy resin-impregnated fiber base X1 and using the sheet state thermosetting resin composition Y7 in place of the sheet state thermosetting resin composition Y1 to obtain an base-attached encapsulant Z9 for semiconductor encapsulation.
<Preparation of Semiconductor Device-Mounted Substrate>
In the same manner as in Example 1, a semiconductor device-mounted substrate was prepared.
<Manufacture of Semiconductor Device-Mounted Substrate After Encapsulation>
The same operation as in Example 1 was carried out except for using the base-attached encapsulant Z9 for semiconductor encapsulation in place of the base-attached encapsulant Z1 for semiconductor encapsulation to obtain a semiconductor device-mounted substrate after encapsulation.

Comparative Example 5

<Production of Base>
The same operation as in Comparative Example 4 was carried out to obtain an epoxy resin-impregnated fiber base X7 having a size of 400 mm×500 mm and a thickness of 0.16 mm.
<Preparation of Resin Composition for Encapsulating Resin Layer>
The same operation as in Example 6 was carried out to obtain a sheet state thermosetting resin composition Y6 having a size of 390 mm×490 mm and a thickness of 0.3 mm. The sheet state thermosetting resin composition Y6 contains the thermoplastic resin in an amount exceeding 2% by mass based on the total mass of the composition.
<Manufacture of Base-Attached Encapsulant for Semiconductor Encapsulation>
The same operation as in Example 1 was carried out except for using the epoxy resin-impregnated fiber base X7 in place of the epoxy resin-impregnated fiber base X1 and using the sheet state thermosetting resin composition Y6 in place of the sheet state thermosetting resin composition Y1 to obtain an base-attached encapsulant Z10 for semiconductor encapsulation.
<Preparation of Semiconductor Device-Mounted Substrate>
In the same manner as in Example 1, a semiconductor device-mounted substrate was prepared.
<Manufacture of Semiconductor Device-Mounted Substrate After Encapsulation>
The same operation as in Example 1 was carried out except for using the base-attached encapsulant Z10 for semiconductor encapsulation in place of the base-attached encapsulant Z1 for semiconductor encapsulation to obtain a semiconductor device-mounted substrate after encapsulation.

Characteristics of the semiconductor device-mounted substrates after encapsulation obtained in Examples 1 to 6 and Comparative Examples 1 to 5, i.e., the semiconductor apparatus before dicing, were evaluated as follows. The evaluation results are shown in Table 2.

(Measurement of Linear Expansion Coefficient)

The linear expansion coefficient $\alpha^1$ of the semiconductor device: The linear expansion coefficient of the semiconductor device used in each of Examples and Comparative Examples was 3 ppm/K.

The linear expansion coefficient $\alpha^2$ of the cured product of the encapsulating resin layer: The sheet state thermosetting resin composition for an encapsulating resin layer used in each of Examples and Comparative Examples was molded by using a metal mold in accordance with the EMMI standard under the conditions of 150° C., 6.9 N/mm$^2$ and a molding time of 300 seconds to prepare a test piece having a size of 5×5×15 mm. By using the test piece, a thermomechanical analysis was carried out by using a TMA apparatus manufactured by RIGAKU Corporation. The linear expansion coefficient was measured by the compression load method under the conditions of a temperature raising rate of 5° C./min and a load of 19.6 mN by measuring from the room temperature to 300° C.

The linear expansion coefficient $\alpha^3$ of the base: On a test piece prepared by cutting the base used in each of Examples and Comparative Examples to a width of 5 mm and a length of 15 mm, a thermomechanical analysis was carried out by using a TMA apparatus manufactured by RIGAKU Corporation. After the test piece was equipped to the device, the linear expansion coefficient in the X-Y direction was measured by the tensile load method under the conditions of a temperature raising rate of 5° C./min and a load of 1 g by measuring from the room temperature to 300° C.

(Warpage Amount of Package)

The obtained semiconductor apparatus was so located that the surface where the silicon chip had been exposed was on the upper surface side, displacement of the height in the diagonal direction of each semiconductor apparatus was measured using a laser three-dimensional measuring machine, and the difference in displacement was made a warpage amount. It was shown by using a positive value when the direction of the warpage was convex downward and a negative value when the convex upward.

(Chemical Resistance)

The obtained semiconductor apparatus was successively dipped in the chemicals A to J shown in Table 1 in this order under the dipping conditions shown therein, and then, the surface of the resin and the cross-section thereof after dipping in all the chemicals were observed by a microscope. The material generating no deterioration such as cracks or fractures was judged as good, and that generating cracks or fractures was judged as bad.

TABLE 1

| Formulation (parts by mass) | Chemicals | | | | | | | | | |
|---|---|---|---|---|---|---|---|---|---|---|
| | A | B | C | D | E | F | G | H | I | J |
| 50 wt % Aqueous sulfuric acid solution | 230 | 100 | | | | | | | | 90 |
| 35 wt % Aqueous hydrogen peroxide | | 10 | | | | | | | 15 | |
| Ethylene glycol monoisopropyl ether | | | 21.5 | | | | | | | |
| Diethylene glycol monoisopropyl ether | | | 21.5 | | | | | | | |
| Potassium hydroxide | | | 30 | | | | | | | |
| Monoethanolamine | | | 30 | | | | | | | |
| Sodium hydroxide | | | | 20 | | | | 45 | | |
| Sodium peroxodisulfate | | | | | 150 | | | | | |
| 50 wt % Aqueous copper sulfate solution | | | | | 35 | | | | | |
| DP-H Accelerator G2 | | | | | | 100 | | | | |
| DH-P Normanity adjuster | | | | | | 100 | | | | |
| Sodium carbonate | | | | | | | 3 | | | |
| Potassium permanganate | | | | | | | | 60 | | |
| Water | 770 | 1890 | 1897 | 980 | 1815 | 800 | 997 | 1895 | 985 | 910 |
| Dipping conditions | | | | | | | | | | |
| Temperature (° C.) | 30 | 40 | 60 | 80 | 35 | 50 | 85 | 85 | 40 | 55 |
| Time (second) | 600 | 600 | 600 | 1500 | 120 | 300 | 600 | 1200 | 300 | 300 |

TABLE 2

| | Example | | | | | | Comparative example | | | | |
|---|---|---|---|---|---|---|---|---|---|---|---|
| | 1 | 2 | 3 | 4 | 5 | 6 | 1 | 2 | 3 | 4 | 5 |
| $\alpha^1$ (ppm/K) | 3 | 3 | 3 | 3 | 3 | 3 | 3 | 3 | 3 | 3 | 3 |
| $\alpha^2$ (ppm/K) | 10 | 7.8 | 11 | 13 | 8.2 | 12 | 10 | 7.8 | 7.8 | 15 | 12 |
| $\alpha^3$ (ppm/K) | 6.5 | 5.5 | 6.5 | 8 | 6.5 | 7 | — | 14 | 7 | 5 | 5 |
| $\alpha^1 + \alpha^2 - 2\alpha^3$ | 0 | −0.2 | 1 | 0 | −1.8 | 1 | — | −17.2 | −3.2 | 8 | 5 |
| $\alpha^3 - \alpha^1$ | 3.5 | 2.5 | 3.5 | 5 | 3.5 | 4 | — | 11 | 4 | 2 | 2 |
| $\alpha^2 - \alpha^3$ | 3.5 | 2.3 | 4.5 | 5 | 1.7 | 5 | — | −6.2 | 0.8 | 10 | 7 |

TABLE 2-continued

|  | Example | | | | | | Comparative example | | | | |
| --- | --- | --- | --- | --- | --- | --- | --- | --- | --- | --- | --- |
|  | 1 | 2 | 3 | 4 | 5 | 6 | 1 | 2 | 3 | 4 | 5 |
| Warpage of package (mm) | 0.1 | 0.1 | 0.2 | 0.2 | 0.1 | 0.3 | −8 | −10 | −5 | 15 | 10 |
| Chemical resistance | good | good | good | good | good | bad | good | good | good | good | bad |

As shown in Table 2, in Examples 1 to 6 in which the linear expansion coefficient $\alpha^1$ of the semiconductor device, the linear expansion coefficient $\alpha^2$ of the cured product of the encapsulating resin layer, and the linear expansion coefficient $\alpha^3$ of the base satisfy both of $\alpha^1<\alpha^3<\alpha^2$ and $-2<\alpha^1+\alpha^2-2\alpha^3<2$, warpage of the package could be suppressed even when a package with a large area was encapsulated. On the other hand, in Comparative Example 1 in which no base was used, or in Comparative Examples 2 to 5 in which $\alpha^1$, $\alpha^2$ and $\alpha^3$ did not satisfy $-2<\alpha^1+\alpha^2-2\alpha^3<2$, larger warpage of the package was generated as compared to those of Examples 1 to 6. In addition, in Examples 1 to 4, and Comparative Examples 1 to 4 in which no thermoplastic resin was blended in the encapsulating resin layer, and in Example 5 in which the thermoplastic resin was blended in the amount of 2% by mass or less based on the total mass of the composition, chemical resistance of the cured products of the encapsulating resin layer was good as compared to those of Example 6 and Comparative Example 5 in which the thermoplastic resin was added to the encapsulating resin layer in an amount exceeding 2% by mass based on the total mass of the composition. Incidentally, when Example 1 and Example 4 having the same ($\alpha^1+\alpha^2-2\alpha^3$) value are compared to each other, warpage was smaller in Example 1 where $\alpha^3-\alpha^1<5$ and $\alpha^2-\alpha^3<5$.

From the above results, it was revealed that the base-attached encapsulant for semiconductor encapsulation of the present invention could suppress warpage of the package even when a package with a large area was encapsulated in the manufacture of the fan-out wafer level package. In addition, it was revealed that chemical resistance of the cured product of the encapsulating resin layer could be made excellent by blending no thermoplastic resin in the encapsulating resin layer, or by blending the thermoplastic resin in a predetermined amount or less even if the thermoplastic resin was blended.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing a semiconductor apparatus comprising collectively encapsulating:
   a device-mounted surface of a semiconductor device-mounted substrate having semiconductor devices mounted thereon, or
   a device-formed surface of a semiconductor device-formed wafer having semiconductor devices formed thereon,
   by a cured product of an encapsulating resin layer of a base-attached encapsulant, wherein
   the base-attached encapsulant for semiconductor encapsulation has a base and an encapsulating resin layer containing an uncured or semi-cured thermosetting resin component formed onto one of the surfaces of the base, and
   a linear expansion coefficient $\alpha^1$ of the semiconductor device to be encapsulated by the base-attached encapsulant for semiconductor encapsulation, a linear expansion coefficient $\alpha^2$ of a cured product of the encapsulating resin layer, and a linear expansion coefficient $\alpha^3$ of the base satisfy both of the following formula (1) and (2);

$$\alpha^1<\alpha^3<\alpha^2 \tag{1}$$

$$-2<\alpha^1+\alpha^2-2\alpha^3<2 \tag{2}$$

wherein the unit of the linear expansion coefficient is ppm/K.

2. The method according to claim 1, wherein the linear expansion coefficient $\alpha^1$, the linear expansion coefficient $\alpha^2$, and the linear expansion coefficient $\alpha^3$ satisfy the following formula (3) and (4), in addition to the formula (1) and (2);

$$\alpha^3-\alpha^1<5 \tag{3}$$

$$\alpha^2-\alpha^3<5 \tag{4}$$

wherein the unit of the linear expansion coefficient is ppm/K.

3. The method according to claim 1, wherein the base is a fiber-containing resin base in which a thermosetting resin composition has been impregnated into a fiber base and cured.

4. The method for manufacturing a semiconductor apparatus according to claim 1, wherein the method comprises:
   a coating step of coating a device-mounted surface of a semiconductor device-mounted substrate, in which semiconductor devices have been temporary fixed onto a support substrate by a laminated temporary fixing material, with the encapsulating resin layer of the base-attached encapsulant for semiconductor encapsulation;
   an encapsulating step of collectively encapsulating the device-mounted surface by heating the encapsulating resin layer to cure the same;
   a temporary fixing material-removing step of removing the temporary fixing material;
   a rewiring step of preparing a rewiring body by forming a rewiring layer onto an exposed surface after removal of the temporary fixing material; and
   a dicing step of manufacturing the semiconductor apparatus by dicing the rewiring body.

* * * * *